United States Patent [19]

Pease

[11] Patent Number: 4,701,779
[45] Date of Patent: Oct. 20, 1987

[54] ISOLATION DIFFUSION PROCESS MONITOR

[75] Inventor: Robert A. Pease, San Francisco, Calif.

[73] Assignee: National Semiconductor Corporation, Santa Clara, Calif.

[21] Appl. No.: 668,595

[22] Filed: Nov. 5, 1984

[51] Int. Cl.⁴ .............................................. H01L 27/04
[52] U.S. Cl. ......................................... 357/48; 357/51
[58] Field of Search ........................ 357/43, 47, 48, 90, 357/51

[56] References Cited

U.S. PATENT DOCUMENTS

| | | | |
|---|---|---|---|
| 3,631,313 | 12/1971 | Moore | 357/47 |
| 4,223,335 | 9/1980 | Kane | 357/48 |
| 4,336,528 | 6/1982 | Kane | 357/48 |
| 4,413,271 | 11/1983 | Gontowski, Jr. et al. | 357/48 |

Primary Examiner—Andrew J. James
Assistant Examiner—Mark Prenty

[57] ABSTRACT

An isolation diffusion process monitor is disclosed. A monitor resistor which has one end terminated in an isolation diffusion region is measured during the wafer fabrication process. Its value will be a function of the lateral surface extent of the isolation diffusion.

4 Claims, 4 Drawing Figures

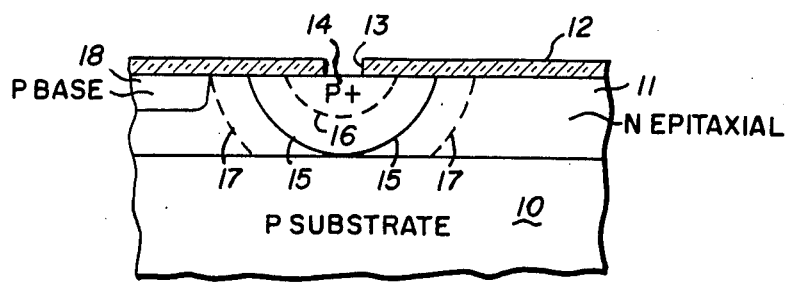
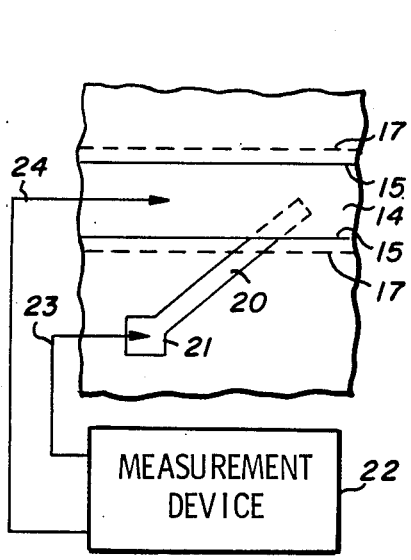
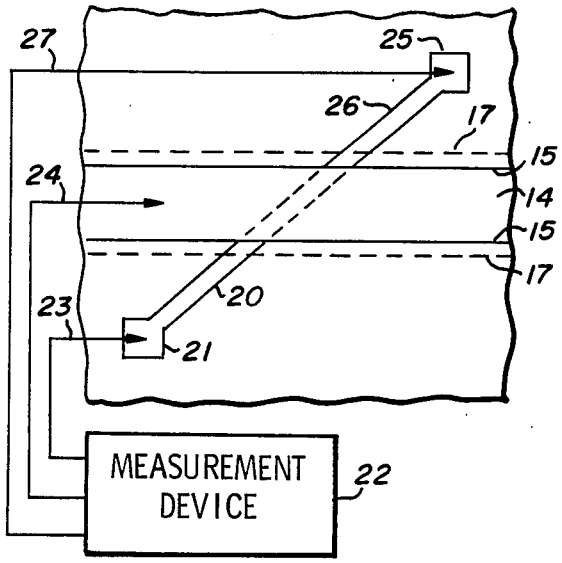
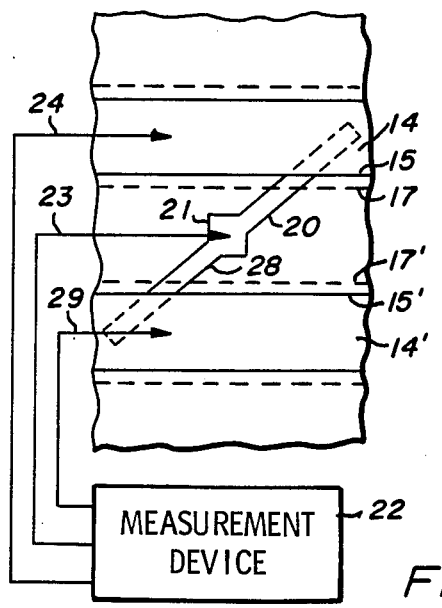

ISOLATION DIFFUSION PROCESS MONITOR

BACKGROUND OF THE INVENTION

Monolithic PN junction isolated integrated circuit (IC) devices employ a common semiconductor substrate. A plurality of such devices is fabricated simultaneously on a semiconductor substrate wafer. One of the process steps involves the diffusion of impurities completely through an epitaxially deposited semiconductor layer. This is called the isolation diffusion because it produces a plurality of isolated regions or tubs of epitaxial material. Circuit element devices such as transistors, diodes, or resistors are then created in the tubs. These circuit elements are ultimately interconnected by metallization applied over a passivating oxide layer that is created over the wafer surface.

The isolation diffusion must effectively penetrate the epitaxial layer. It must be deep enough to fully penetrate the epitaxial layer even at its thickest extremes on the wafer. Typically the process is operated so that substantial over-diffusion occurs. Then the process variables will not result in incomplete penetration. However, this concept is often carried to an extreme wherein greatly excessive isolation penetration is achieved. Since the diffusion penetration is accompanied by a lateral surface extension excessive diffusion will reduce the wafer surface area that could be used for circuit element devices, or it may result in electrical short circuits.

It would be desirable to monitor the isolation diffusion process to make sure that the isolation is effective and that the isolation over-diffusion is not excessive.

SUMMARY OF THE INVENTION

It is an object of the invention to monitor isolation diffusion in an IC by measuring the value of a resistor that terminates in an isolation region.

It is a further object of the invention to include a monitor resistor in the IC structure in which one end of the resistor intersects an isolation diffusion so that the resistance value is a function of the degree of isolation diffusion.

It is a still further object of the invention to form a monitor resistor in an IC so that it spans an isolation diffusion and to measure the resistance value to determine the degree of isolation diffusion.

These and other objects are achieved as follows. A monitor resistor is created in an IC wherein one end of the resistor terminates inside an isolation region. The other end of the resistor terminates in a contact region which is of the conventional dog-bone shape. If possible, the contact region is made more conductive than the resistor body. Desirably, the resistor body makes an acute angle with respect to the edge of the isolation region. The resistor is measured and its value can be correlated with the degree of isolation diffusion. If desired, the resistor can be extended to fully span the isolation region and extend to a second contact located on the opposite side of the isolation region. The resistance between the two contacts is measured to determine the amount of isolation diffusion. As another alternative embodiment, the resistor can be located to span the space between two spaced apart isolation regions. A contact region is located at the center of the resistor between the isolation regions. In this case the resistance between the contact and the isolation regions is measured.

BRIEF DESCRIPTION OF THE DRAWING

FIG. 1 is a cross section of a fragment of an IC showing the effect of isolation diffusion as it has existed in the prior art.

FIG. 2 is a topographic view of a fragment of an IC containing a monitor resistor of the invention.

FIG. 3 is an alternative embodiment of the invention.

FIG. 4 is another alternative embodiment of the invention.

DESCRIPTION OF THE INVENTION

FIG. 1 is a cross section of a fragment of a monolithic PN junction isolated IC wafer, showing the typical relationships of the parts as is well known in the prior art. The drawing is not to scale. The vertical dimension has been exaggerated to better illustrate the concepts. A P type substrate 10 has an N type epitaxial layer 11 deposited thereon. A passivating oxide layer 12 is located on top of the wafer. An isolation cut 13 is made in the passivating oxide to locate a heavily doped or P+ isolation diffusion 14. Line 15 shows the desired extent of region 15. Ideally, the isolation region 14 extends completely through epitaxial layer 11 so that portions thereof, commonly called tubs, are electrically isolated from the rest of the wafer by the resulting PN junction.

The diffusion process is not totally controlled and the isolation diffusion can vary from the ideal condition. Dashed line 16 shows under-isolation wherein the isolation diffusion does not extend completely through epitaxial layer 11. In this case the isolation is not complete and leakage between adjacent tubs will be present. It can be seen that the lateral surface extent of the preferred isolation region 15 is about equal to twice the epitaxial layer thickness. Dashed line 17 represents a case of over-isolation. While the epitaxial layer is penetrated and isolation will be achieved, it is clear that the lateral surface diffusion uses up IC area that could more profitably be used for circuit elements. Thus, over-isolation is wasteful of IC surface area and is to be avoided where possible. Region 18 is representative of a transistor base (or possible a diffused resistor). In a conventional junction isolated integrated circuit diffused resistors are fabricated from the same material and at the same time in the process as the vertical transistor bases. In the structure shown in FIG. 1 this would be of p-type conductivity. The device layout design rules will space region 18 sufficiently from oxide cut 13 to ensure that the isolation diffusion tolerance will adequately separate regions 14 and 18 even though some over-isolation occurs.

Typically, IC processing is adjusted so that under isolation occurs only rarely. This means that some over-diffusion is built in and normal. The topography of the IC is adjusted to accommodate the normal over-diffusion.

FIG. 2 shows an IC topography that employs the monitor resistor of the invention. A fragment of an IC wafer is shown. For the purpose of clarity the passivating oxide layer is not illustrated. Region 14 represents the isolation diffusion which is bounded by line 15. Dashed line 17 represents over diffusion. A resistor 20 extends into isolation 14 as shown by the dashed outline. It is desirable that this extension runs into the most heavily doped isolation region portion which occurs at its center. The other end of the resistor is terminated in contact 21. Where the process admits, contact 21 can be made more conductive than resistor 20. This is referred to as a P+ contact region. Monitor resistor 20 is shown forming an acute angle with respect to line 15. Actually, this angle could be made close to 90 degrees, but such a shape would give less resolution of distance. Therefore, the acute angle is preferred.

At some point in the IC processing, normally after transistor bases and resistors have been diffused into the IC wafer, resistor 20 is measured. Measurement device 22, which could be a simple ohm meter, is connected by way of probes 23 and 24 to contact 21 and isolation region 14. It can be seen that in the event of over diffusion, as indicated by dashed line 17, the resistance will be low. If desired a plot of diffusion versus resistance can be constructed and the desired limits established on a trial basis.

While not illustrated herein, some IC designs include a transistor base cap or overlay that lies over the isolation. Such a cap would ordinarily extend well beyond the isolation region itself. Where this form of IC construction is used, the cap would be eliminated in the vicinity of the monitor resistor structure.

FIG. 3 shows an alternative embodiment of the invention. Here a second contact 25 is established on the opposite side of isolation region 14 and resistor 20 is extended at 26 so as to connect contacts 21 and 25. The isolation diffusion 14 will short out (or at least substantially reduce the value of) that portion of the resistor which spans it so that the resistance will be a function of the extent of the isolation diffusion. Measurement device 22 is connectible to contact 21 and isolation diffusion 14 by way of probes 23 and 24. Probe 27 is applied to contact 25.

By using a two-sided structure the measurement can also show a misalignment. For example, a measurement of the resistance between contacts 21 and 25 will relate to the lateral isolation diffusion. By comparing the resistance values of elements 20 and 26 any unbalance will indicate a misalignment of the resistor with respect to the isolation diffusion. If desired, contacts 21 and 25 can be connected together and the resistance to region 14 measured. This resistance value will be related to the extent of lateral diffusion and misalignment errors in the test resistor will tend to cancel.

FIG. 4 shows another alternative embodiment of the invention. Here a second isolation region 14' is established adjacent to region 14. A second extension 28 of resistor 20 is arranged to overlap isolation region 14' as shown by the dashed outline. This second resistor element also terminates at contact 21. The measurement device 20 is shown connected to isolation region 14' by probe 29. Probes 24 and 29 are to be connected together and the resistance measured to probe 23. This will connect resistance elements 20 and 28 in parallel and the value will be related to the over diffusion. This parallel connection will also have the effect of reducing test resistor misalignment errors.

While the foregoing description shows the use of probes to contact isolation diffusion regions, it is to be understood that the wafer substrate is connected to the isolation regions. This will normally occur unless under diffusion is present as was described in connection with line 16 of FIG. 1. Accordingly, where probe contact to the isolation diffusions is shown a wafer backside contact to the substrate can be used.

The foregoing description also shows the resistor elements as running in a straight line. If desired, these elements can be curved or the angle with respect to the isolation diffusion varied along its length. This will have the effect of changing the shape of the curve of a plot of resistance versus over isolation.

The invention has been described and alternative embodiments detailed. When a person skilled in the art reads the description alternatives and equivalents, within the spirit and intent of the invention, will be apparent. Accordingly, it is intended that the scope of the invention be limited only by the following claims.

I claim:

1. In a PN junction isolated monolithic integrated circuit wherein an isolation diffusion is extended through an epitaxial layer desposited upon an opposite conductivity type substrate, said isolation diffusion having a lateral surface diffusion component as well as a diffusion component extending normal to the surface which acts to provide the desired isolation, a monitor resistor for evaluating the extent of said lateral surface diffusion comprising:
   means for electrically contacting said isolation diffusion;
   resistor contact means spaced apart from said isolation diffusion and having the same conductivity type as said isolation diffusion; and
   a resistor pattern having the same conductivity type as said isolation diffusion and extending between said resistor contact and said isolation diffusion whereby said resistor value is related to the lateral surface diffusion of said isolation diffusion.

2. The monitor resistor of claim 1 wherein said integrated circuit has vertically arrayed bipolar transistors with base regions having a conductivity type opposite to that of said epitaxial layer and said resistor pattern is fabricated using said base region material.

3. The monitor resistor of claim 1 wherein said resistor contact means comprise a pair of contacts spaced on opposite sides of a strip of isolation diffusion and said resistor pattern joins said pair of contacts so that a resistor element spans said strip of isolation diffusion.

4. The monitor resistor of claim 3 wherein said pair of contacts are spaced apart along the lateral extent of said isolation diffusion strip so that said resistor element extends from said isolation diffusion strip at an acute angle.

* * * * *